（12）United States Patent
Monson

(10) Patent No.: US 12,287,940 B2
(45) Date of Patent: Apr. 29, 2025

(54) NOISE MEASUREMENTS WITH A CAPACITANCE SENSOR

(71) Applicant: Cirque Corporation, Sandy, UT (US)

(72) Inventor: Brian Monson, Farmington, UT (US)

(73) Assignee: Cirque Corporation, Sandy, UT (US)

( * ) Notice: Subject to any disclaimer, the term of this patent is extended or adjusted under 35 U.S.C. 154(b) by 207 days.

(21) Appl. No.: 18/123,474

(22) Filed: Mar. 20, 2023

(65) Prior Publication Data

US 2024/0319825 A1   Sep. 26, 2024

(51) Int. Cl.
*G06F 3/041* (2006.01)
*G01R 27/26* (2006.01)
*G06F 3/044* (2006.01)

(52) U.S. Cl.
CPC ..... *G06F 3/04186* (2019.05); *G01R 27/2605* (2013.01); *G06F 3/0446* (2019.05); *G06F 2203/04107* (2013.01)

(58) Field of Classification Search
CPC ............... G06F 3/04186; G06F 3/0446; G06F 2203/04107; G01R 27/2605
See application file for complete search history.

(56) References Cited

U.S. PATENT DOCUMENTS

| | | | |
|---|---|---|---|
| 5,510,813 A * | 4/1996 | Makinwa | G06F 3/044 345/173 |
| 7,031,886 B1 | 4/2006 | Hargreaves | |
| 7,643,011 B2 | 1/2010 | O'Connor et al. | |
| 8,866,347 B2 | 10/2014 | Benkley, III | |
| 8,970,547 B2 | 3/2015 | Sabo et al. | |
| 9,223,449 B2 | 12/2015 | Lee | |
| 9,348,477 B2 | 5/2016 | Reynolds | |
| 9,411,928 B2 | 8/2016 | Karpin et al. | |
| 9,444,452 B2 | 9/2016 | Ksondzyk et al. | |
| 9,547,396 B2 | 1/2017 | Wang et al. | |
| 9,781,735 B2 | 10/2017 | Comsa et al. | |
| 10,209,845 B2 | 2/2019 | Shepelev et al. | |
| 10,725,591 B1 | 7/2020 | Maharyta et al. | |
| 10,795,504 B2 | 10/2020 | Dinu | |
| 2008/0180165 A1* | 7/2008 | Mijuskovic | G01D 5/24 327/551 |
| 2011/0210940 A1 | 9/2011 | Reynolds | |
| 2015/0205438 A1* | 7/2015 | Kremin | G06F 3/04182 345/174 |
| 2015/0309614 A1 | 10/2015 | Waldron | |
| 2015/0309658 A1 | 10/2015 | Stevenson | |

(Continued)

FOREIGN PATENT DOCUMENTS

| | | |
|---|---|---|
| KR | 20170046005 A | 4/2017 |
| KR | 20190042056 A | 3/2022 |

*Primary Examiner* — Paresh Patel

(57) ABSTRACT

Using a capacitance sensor may include taking a first noise measurement by imposing a first signal on a capacitance sensor, the first signal having a first frequency; taking a second noise measurement by imposing a second signal on the capacitance sensor, the second signal having a second frequency different than the first frequency; determining the measurement with the lower amount of noise between the first noise measurement and the second noise measurement; and taking a capacitance measurement by imposing a third signal on the capacitance sensor, the third signal having either the first frequency or the second frequency based, at least in part, on the frequency of the measurement with the lower amount of noise.

14 Claims, 12 Drawing Sheets

(56) References Cited

U.S. PATENT DOCUMENTS

| | | |
|---|---|---|
| 2017/0168604 A1 | 6/2017 | Schwartz |
| 2017/0269778 A1* | 9/2017 | Khazeni |
| 2019/0079634 A1* | 3/2019 | Kravets .................. G06F 3/045 |
| 2022/0043531 A1* | 2/2022 | Tang .................... G01D 5/2403 |
| 2022/0121298 A1 | 4/2022 | Ding et al. |

* cited by examiner

NOISE MEASUREMENTS WITH A CAPACITANCE SENSOR

FIELD OF THE DISCLOSURE

This disclosure relates generally to systems and methods for taking capacitance measurements with a capacitance sensor. In particular, this disclosure relates to systems and methods for using a capacitance sensor in a capacitance module to reduce noise in capacitance measurements.

BACKGROUND

In several devices, such as laptops and touchscreen computers, a capacitance sensor may be used to detect user input. A capacitance sensor generally detects input by applying a voltage to a transmit electrode in the capacitance sensor and measuring the change in the electric field on a sense electrode in the capacitance sensor. User input changes the electric field measured on the sense electrode, which enables the capacitance sensor to detect the location of the input. The sense electrode may be susceptible to electrical noise, which can decrease the ability of a capacitance sensor to detect the location of user input accurately and precisely. Many methods and systems exist to reduce the noise of capacitance measurements measured by a capacitance sensor.

An example of a system for reducing noise in capacitance measurements is disclosed in U.S. Pat. No. 8,941,394 issued to Bradley Martin, et al. This reference discloses a system for reducing noise when detecting the capacitance value of a capacitor in a touch display that operates in a potentially noisy environment. A capacitance sensor is provided for determining the size of the capacitor in the touch screen display and includes a charging circuit that charges the capacitor and a discharge circuit that resets the charge of the capacitor to substantially zero. A control circuit controls the capacitance sensor and the operation of the charge and discharge circuits in accordance with a predetermined charging/discharging algorithm to resolve the value of the capacitor and output such value in a sampling operation. The operation of the control circuit and the charging/discharging algorithm is subject to errors as a function of the noisy environment, which errors will be reflected in the output value. A noise reduction circuit is provided to modify the operation of the control circuit to reduce noise.

Another example of a method for reducing noise in capacitance measurements is disclosed in U.S. Pat. No. 8,564,565 issued to Jonathan Westhues. This reference discloses techniques for providing a cleaned signal in a capacitive touch sensor. A phase of periodic noise on an input of the capacitive touch sensor is determined, and a periodic excitation signal having a phase that is locked to the determined phase of the periodic noise is generated. The periodic excitation signal is applied to an excited conductor in a first array of the touch sensor. While the excitation signal is applied, a response signal on a responding conductor in a second array of the touch sensor is detected, and based on the detected response signal, a value indicative of a measured capacitance between the excited conductor and the responding conductor is generated. A threshold value is accessed, and a determination is made whether the response signal corresponds to a touch based on a difference between the value and the threshold value.

Yet another example of a method for reducing noise in capacitance measurements is disclosed in U.S. Pat. No. 8,976,145 issued to David C. Taylor, et al. This reference discloses techniques for decreasing the cost of a touchpad by avoiding the cost of simultaneously measuring all signals from sense electrodes by using a limited number of measuring circuits to accomplish noise reduction and de-ghosting of signal data to thereby obtain the precise location of multiple fingers on a touchpad, wherein the touchpad separates the drive electrodes into groups to thereby provide a means for obtaining granular location information for de-ghosting the touchpad, and wherein overlapping measurements are made of groups of sense electrodes to obtain data that is separated in time to thereby obtain an averaged signal for each electrode and thereby reduce sensitivity to noise.

Each of these references are herein incorporated by reference for all that they disclose.

SUMMARY

In one embodiment, a method of using a capacitance sensor may include taking a first noise measurement by imposing a first signal on a capacitance sensor, the first signal having a first frequency; taking a second noise measurement by imposing a second signal on the capacitance sensor, the second signal having a second frequency different than the first frequency; determining the measurement with the lower amount of noise between the first noise measurement and the second noise measurement; and taking a capacitance measurement by imposing a third signal on the capacitance sensor, the third signal having either the first frequency or the second frequency based, at least in part, on the frequency of the measurement with the lower amount of noise.

The first noise measurement and the second noise measurement may be taken using a dedicated sense electrode in the capacitance sensor.

The first noise measurement and the second noise measurement may be taken at the same time.

The capacitance measurement and the first noise measurement may be taken at the same time.

The capacitance measurement and the second noise measurement may be taken at the same time.

In another embodiment, a method of using a capacitance sensor may include taking a first noise measurement by imposing a first signal on a capacitance sensor, the first signal having a first frequency; taking a first capacitance measurement by imposing a second signal on the capacitance sensor, the second signal having the first frequency; taking a second noise measurement by imposing a third signal on the capacitance sensor, the third signal having a second frequency; taking a second capacitance measurement by imposing a fourth signal on the capacitance sensor, the fourth signal having the second frequency; and determining a user input location based, at least in part, on the first noise measurement and the second noise measurement.

The first noise measurement and the second noise measurement may be taken using a dedicated sense electrode in the capacitance sensor.

Determining the user input location may include comparing the amplitude of the first noise measurement and the amplitude of the second noise measurement.

The first capacitance measurement and the first noise measurement may be taken at the same time.

The second capacitance measurement and the second noise measurement are taken at the same time.

In another embodiment, a capacitance module may include a set of electrodes; a sense electrode electrically independent from the set of electrodes; processing resources in electrical communication with the set of electrodes and the sense electrode; wherein the processing resources include a processor and memory, the memory including programmed instructions that cause the processor, when executed, to: take a first noise measurement by imposing a first signal on the sense electrode, the first signal having a first frequency; take a second noise measurement by imposing a second signal on the sense electrode, the second noise signal having a second frequency; and take a capacitance measurement by imposing a third signal on the set of electrodes, the third signal having a third frequency.

The first noise measurement and the second noise measurement may be taken at the same time.

The third frequency may be the same as the first frequency or the same as the second frequency, based in part on the amplitude of the first noise measurement and the amplitude of the second noise measurement.

The programmed instructions may include further instructions which cause the processor, when executed, to determine a location of user input based, in part, on the capacitance measurement.

The location of the sense electrode may be based, in part, on the regions of greatest noise in the capacitance module.

The capacitance module may include shielding material located between the set of electrodes and the sense electrode.

The programmed instructions may include further instructions which cause the processor, when executed, to take a second capacitance measurement by imposing a fourth signal on the set of electrodes, the fourth signal having a fourth frequency.

The first input signal and the first noise signal may be measured at the same time, and the second input signal and the second noise signal may be measured at the same time.

The third frequency may be the same as the first frequency, and the fourth frequency may be the same as the second frequency.

The programmed instructions may include further instructions which cause the processor, when executed, to determine a location of user input based, in part, on the first noise measurement and the second noise measurement.

A capacitance module may include a set of electrodes; a noise sense electrode electrically independent from the set of capacitance electrodes; processing resources in electrical communication with the set of capacitance electrodes and the noise sense electrode where the processing resources include a processor and memory, the memory including programmed instructions that cause the processor, when executed, to take a first noise measurement by imposing a first signal on the noise sense electrode, the first signal having a first frequency; take a second noise measurement by imposing a second signal on the noise sense electrode, the second noise signal having a second frequency; and take a capacitance measurement by imposing a third signal on the set of capacitance electrodes, the third signal having a third frequency where the third frequency may be the same as the first frequency when the first noise measurement may be lower than the second noise measurement or the third frequency may be the same as the second frequency when the second noise measurement may be lower than the first noise measurement.

The capacitance module may include shielding that electrically isolates the noise sense electrode from the set of capacitance electrodes.

A capacitance module may include a substrate; a capacitance measuring electrode on a surface of the substrate; the capacitance measuring electrode being part of a user input location detection circuit; a noise sense electrode electrically isolated from the capacitance measuring electrode where the controller includes a processor and memory, the memory including programmed instructions that cause the processor, when executed, to take a capacitance measurement by transmitting a signal on the capacitance measuring electrode; and measuring a resulting capacitance level resulting from the transmitted signal; take a noise measurement by measuring an ambient capacitance level where the noise measurement may be insulated from the resulting capacitance level.

The capacitance measuring electrode may be a self-capacitance electrode.

The measuring the resulting capacitance level may be measured with the self-capacitance electrode.

The measuring the resulting capacitance level may be measured with a capacitance sense electrode that may be part of the user input location detection circuit.

The noise sense electrode may be insulated from the resulting capacitance level with shielding.

The shielding may be a shield layer of the capacitance module.

The noise sense electrode may be insulated from the resulting capacitance level by being spaced far enough away from the capacitance measuring electrode to be out of range of the resulting capacitance level.

The noise sense electrode may be located on a component layer of the capacitance module.

The noise sense electrode may be located on the substrate.

Figure 1:
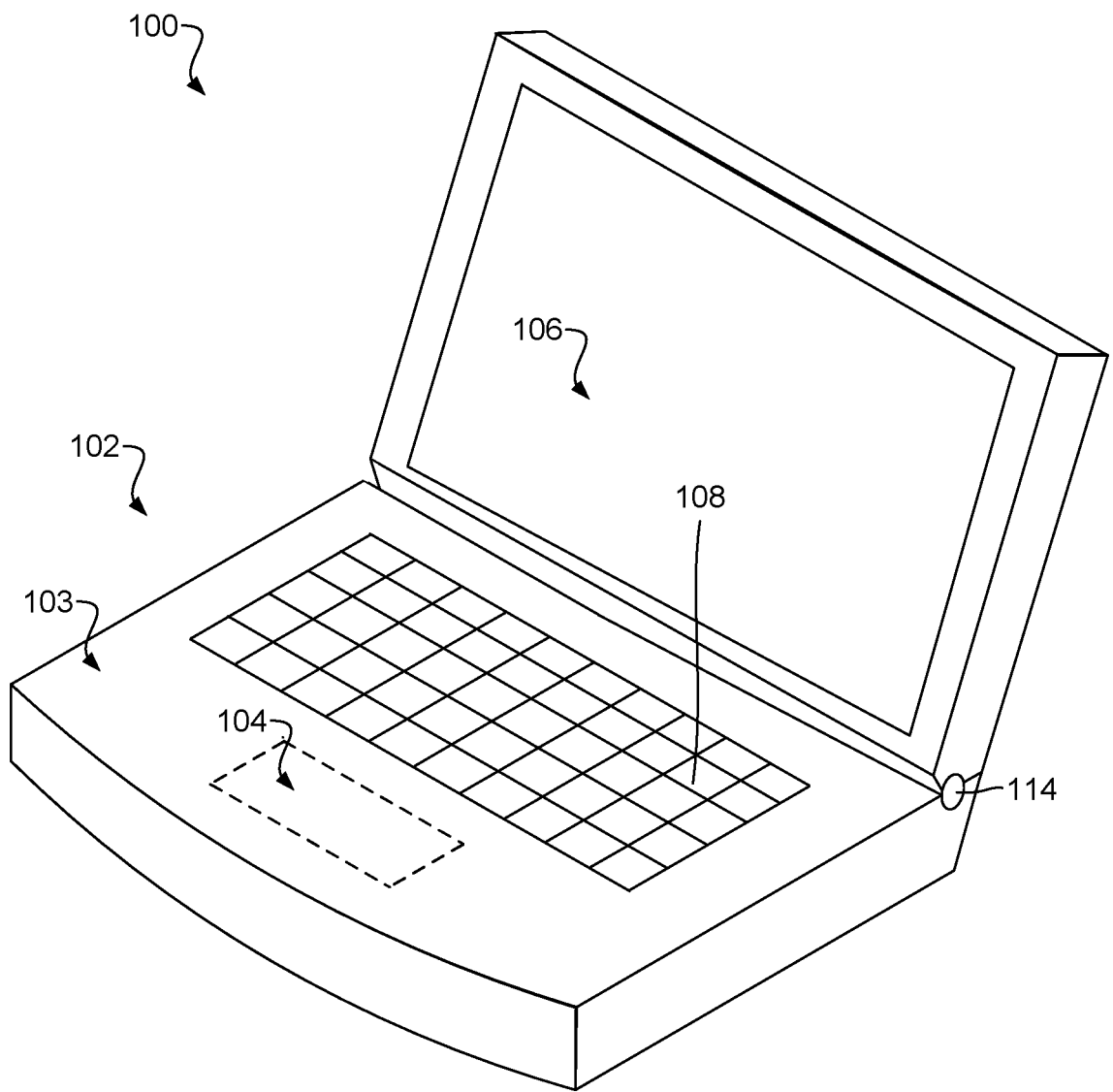
FIG. 1 depicts an example of an electronic device in accordance with the disclosure.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the spirit and scope of the invention as defined by the appended claims.

DETAILED DESCRIPTION OF THE INVENTION

This description provides examples, and is not intended to limit the scope, applicability, or configuration of the invention. Rather, the ensuing description will provide those skilled in the art with an enabling description for implementing embodiments of the invention. Various changes may be made in the function and arrangement of elements.

Thus, various embodiments may omit, substitute, or add various procedures or components as appropriate. For instance, it should be appreciated that the methods may be performed in an order different than that described, and that various steps may be added, omitted, or combined. Also, aspects and elements described with respect to certain embodiments may be combined in various other embodiments. It should also be appreciated that the following systems, methods, devices, and software may individually or collectively be components of a larger system, wherein other procedures may take precedence over or otherwise modify their application.

For purposes of this disclosure, the term "aligned" generally refers to being parallel, substantially parallel, or forming an angle of less than 35.0 degrees. For purposes of this disclosure, the term "transverse" generally refers to perpendicular, substantially perpendicular, or forming an angle between 55.0 and 125.0 degrees. For purposes of this disclosure, the term "length" generally refers to the longest dimension of an object. For purposes of this disclosure, the term "width" generally refers to the dimension of an object from side to side and may refer to measuring across an object perpendicular to the object's length.

For purposes of this disclosure, the term "electrode" may generally refer to a portion of an electrical conductor intended to be used to make a measurement, and the terms "route" and "trace" generally refer to portions of an electrical conductor that are not intended to make a measurement. For purposes of this disclosure in reference to circuits, the term "line" generally refers to the combination of an electrode and a "route" or "trace" portions of the electrical conductor. For purposes of this disclosure, the term "Tx" generally refers to a transmit line, electrode, or portions thereof, and the term "Rx" generally refers to a sense line, electrode, or portions thereof.

For the purposes of this disclosure, the term "electronic device" may generally refer to devices that can be transported and include a battery and electronic components. Examples may include a laptop, a desktop, a mobile phone, an electronic tablet, a personal digital device, a watch, a gaming controller, a gaming wearable device, a wearable device, a measurement device, an automation device, a security device, a display, a vehicle, an infotainment system, an audio system, a control panel, another type of device, an athletic tracking device, a tracking device, a card reader, a purchasing station, a kiosk, or combinations thereof.

It should be understood that use of the terms "capacitance module," "touch pad" and "touch sensor" throughout this document may be used interchangeably with "capacitive touch sensor," "capacitive sensor," "capacitance sensor," "capacitive touch and proximity sensor," "proximity sensor," "touch and proximity sensor," "touch panel," "trackpad," "touch pad," and "touch screen."

It should also be understood that, as used herein, the terms "vertical," "horizontal," "lateral," "upper," "lower," "left," "right," "inner," "outer," etc., can refer to relative directions or positions of features in the disclosed devices and/or assemblies shown in the Figures. For example, "upper" or "uppermost" can refer to a feature positioned closer to the top of a page than another feature. These terms, however, should be construed broadly to include devices and/or assemblies having other orientations, such as inverted or inclined orientations where top/bottom, over/under, above/below, up/down, and left/right can be interchanged depending on the orientation.

In some cases, the capacitance module is located within a housing. The capacitance module may be underneath the housing and capable of detecting objects outside of the housing. In examples, where the capacitance module can detect changes in capacitance through a housing, the housing is a capacitance reference surface. For example, the capacitance module may be disclosed within a cavity formed by a keyboard housing of a computer, such as a laptop or other type of computing device, and the sensor may be disposed underneath a surface of the keyboard housing. In such an example, the keyboard housing adjacent to the capacitance module is the capacitance reference surface. In some examples, an opening may be formed in the housing, and an overlay may be positioned within the opening. In this example, the overlay is the capacitance reference surface. In such an example, the capacitance module may be positioned adjacent to a backside of the overlay, and the capacitance module may sense the presence of the object through the thickness of the overlay. For the purposes of this disclosure, the term "reference surface" may generally refer to a surface through which a pressure sensor, a capacitance sensor, or another type of sensor is positioned to sense a pressure, a presence, a position, a touch, a proximity, a capacitance, a magnetic property, an electric property, another type of property, or another characteristic, or combinations thereof that indicates an input. For example, the reference surface may be a housing, an overlay, or another type of surface through which the input is sensed. In some examples, the reference surface has no moving parts. In some examples, the reference surface may be made of any appropriate type of material, including, but not limited to, plastics, glass, a dielectric material, a metal, another type of material, or combinations thereof.

For the purposes of this disclosure, the term "display" may generally refer to a display or screen that is not depicted in the same area as the capacitive reference surface. In some cases, the display is incorporated into a laptop where a keyboard is located between the display and the capacitive reference surface. In some examples where the capacitive reference surface is incorporated into a laptop, the capacitive reference surface may be part of a touch pad. Pressure sensors may be integrated into the stack making up the capacitance module. However, in some cases, the pressure sensors may be located at another part of the laptop, such as under the keyboard housing, but outside of the area used to sense touch inputs, on the side of the laptop, above the keyboard, to the side of the keyboard, at another location on the laptop, or at another location. In examples where these principles are integrated into a laptop, the display may be pivotally connected to the keyboard housing. The display may be a digital screen, a touch screen, another type of screen, or combinations thereof. In some cases, the display is located on the same device as the capacitive reference surface, and in other examples, the display is located on another device that is different from the device on which the capacitive reference surface is located. For example, the display may be projected onto a different surface, such as a wall or projector screen. In some examples, the reference surface may be located on an input or gaming controller, and the display is located on a wearable device, such as a virtual reality or augmented reality screen. In some cases, the reference surface and the display are located on the same surface, but on separate locations on that surface. In other examples, the reference surface and the display may be integrated into the same device, but on different surfaces. In some cases, the reference surface and the display may be oriented at different angular orientations with respect to each other.

For the purposes of this disclosure, the term "peak-to-peak voltage" may generally refer to a measurement of a time varying voltage signal. The peak-to-peak voltage may be calculated by the magnitude of the difference between the voltage maximum and the voltage minimum within a time period. The peak-to-peak voltage may generally be considered a measurement of the overall magnitude of a voltage signal.

For the purposes of this disclosure, the term "root mean squared (RMS) voltage" may generally refer to a measurement of a time varying voltage signal. The RMS voltage may be calculated as the square root of the sum of the instantaneous voltage averages within a time period squared. The RMS voltage may also be referred to as an "effective voltage." The RMS voltage may generally be considered a measurement of the overall magnitude of a voltage signal.

FIG. 1 depicts an example of an electronic device 100. In this example, the electronic device is a laptop. In the illustrated example, the electronic device 100 includes input components, such as a keyboard 102 and a capacitive module, such as a touch pad 104, that are incorporated into a housing 103. The electronic device 100 also includes a display 106. A program operated by the electronic device 100 may be depicted in the display 106 and controlled by a sequence of instructions that are provided by the user through the keyboard 102 and/or through the touch pad 104. An internal battery (not shown) may be used to power the operations of the electronic device 100.

The keyboard 102 includes an arrangement of keys 108 that can be individually selected when a user presses on a key with a sufficient force to cause the key 108 to be depressed towards a switch located underneath the keyboard 102. In response to selecting a key 108, a program may receive instructions on how to operate, such as a word processing program determining which types of words to process. A user may use the touch pad 104 to give different types of instructions to the programs operating on the computing device 100. For example, a cursor depicted in the display 106 may be controlled through the touch pad 104. A user may control the location of the cursor by sliding his or her hand along the surface of the touch pad 104. In some cases, the user may move the cursor to be located at or near an object in the computing device's display and give a command through the touch pad 104 to select that object. For example, the user may provide instructions to select the object by tapping the surface of the touch pad 104 one or more times.

The touch pad 104 is a capacitance module that includes a stack of layers disposed underneath the keyboard housing, underneath an overlay that is fitted into an opening of the keyboard housing, or underneath another capacitive reference surface. In some examples, the capacitance module is located in an area of the keyboard's surface where the user's palms may rest while typing. The capacitance module may include a substrate, such as a printed circuit board or another type of substrate. One of the layers of the capacitance module may include a sensor layer that includes a first set of electrodes oriented in a first direction and a second layer of electrodes oriented in a second direction that is transverse the first direction. These electrodes may be spaced apart and/or electrically isolated from each other. The electrical isolation may be accomplished by deposited at least a portion of the electrodes on different sides of the same substrate or providing dedicated substrates for each set of electrodes. Capacitance may be measured at the overlapping intersections between the different sets of electrodes. However, as an object with a different dielectric value than the surrounding air (e.g., finger, stylus, etc.) approach the intersections between the electrodes, the capacitance between the electrodes may change. This change in capacitance and the associated location of the object in relation to the capacitance module may be calculated to determine where the user is touching or hovering the object within the detection range of the capacitance module. In some examples, the first set of electrodes and the second set of electrodes are equidistantly spaced with respect to each other. Thus, in these examples, the sensitivity of the capacitance module is the same in both directions. However, in other examples, the distance between the electrodes may be non-uniformly spaced to provide greater sensitivity for movements in certain directions.

In some cases, the display 106 is mechanically separate and movable with respect to the keyboard with a connection mechanism 114. In these examples, the display 106 and keyboard 102 may be connected and movable with respect to one another. The display 106 may be movable within a range of 0 degrees to 180 degrees or more with respect to the keyboard 102. In some examples, the display 106 may fold over onto the upper surface of the keyboard 102 when in a closed position, and the display 106 may be folded away from the keyboard 102 when the display 106 is in an operating position. In some examples, the display 106 may be orientable with respect to the keyboard 102 at an angle between 35 to 135 degrees when in use by the user. However, in these examples, the display 106 may be positionable at any angle desired by the user.

In some examples, the display 106 may be a non-touch sensitive display. However, in other examples at least a portion of the display 106 is touch sensitive. In these examples, the touch sensitive display may also include a capacitance module that is located behind an outside surface of the display 106. As a user's finger or other object approaches the touch sensitive screen, the capacitance module may detect a change in capacitance as an input from the user.

While the example of FIG. 1 depicts an example of the electronic device being a laptop, the capacitance sensor and touch surface may be incorporated into any appropriate device. A non-exhaustive list of devices includes, but is not limited to, a desktop, a display, a screen, a kiosk, a computing device, an electronic tablet, a smart phone, a location sensor, a card reading sensor, another type of electronic device, another type of device, or combinations thereof.

Figure 2:
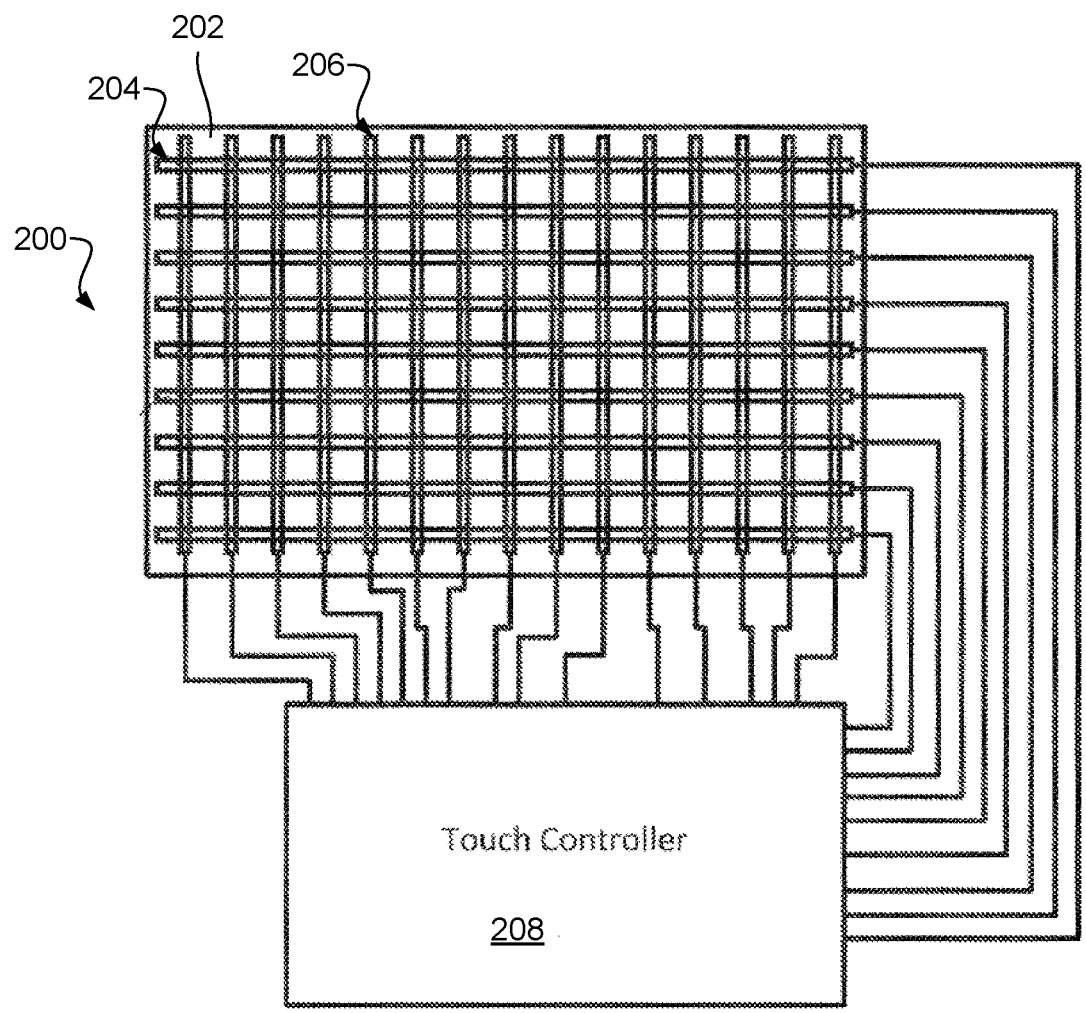
FIG. 2 depicts an example of a substrate with a first set of electrodes and a second set of electrodes in accordance with the disclosure.

FIG. 2 depicts an example of a portion of a capacitance module 200. In this example, the capacitance module 200 may include a substrate 202, first set 204 of electrodes, and a second set 206 of electrodes. The first and second sets 204, 206 of electrodes may be oriented to be transverse to each other. Further, the first and second sets 204, 206 of electrodes may be electrically isolated from one another so that the electrodes do not short to each other. However, where electrodes from the first set 204 overlap with electrodes from the second set 206, capacitance can be measured. The capacitance module 200 may include one or more electrodes in the first set 204 or the second set 206. Such a substrate 202 and electrode sets may be incorporated into a touch screen, a touch pad, a location sensor, a gaming controller, a button, and/or detection circuitry.

In some examples, the capacitance module 200 is a mutual capacitance sensing device. In such an example, the substrate 202 has a set 204 of row electrodes and a set 206 of column electrodes that define the touch/proximity-sensitive area of the component. In some cases, the component is configured as a rectangular grid of an appropriate number of electrodes (e.g., 8-by-6, 16-by-12, 9-by-15, or the like).

As shown in FIG. 2, the capacitance module 208 includes a capacitance controller 208. The capacitance controller 208 may include at least one of a central processing unit (CPU), a digital signal processor (DSP), an analog front end (AFE) including amplifiers, a peripheral interface controller (PIC), another type of microprocessor, and/or combinations thereof, and may be implemented as an integrated circuit, a field programmable gate array (FPGA), an application specific integrated circuit (ASIC), a combination of logic gate circuitry, other types of digital or analog electrical design components, or combinations thereof, with appropriate circuitry, hardware, firmware, and/or software to choose from available modes of operation.

In some cases, the capacitance controller 208 includes at least one multiplexing circuit to alternate which of the sets 204, 206 of electrodes are operating as drive electrodes and sense electrodes. The driving electrodes can be driven one at a time in sequence, or randomly, or drive multiple electrodes at the same time in encoded patterns. Other configurations are possible such as a self-capacitance mode where the electrodes are driven and sensed simultaneously.

Electrodes may also be arranged in non-rectangular arrays, such as radial patterns, linear strings, or the like. A shield layer (see FIG. 3) may be provided beneath the electrodes to reduce noise or other interference. The shield may extend beyond the grid of electrodes. Other configurations are also possible.

In some cases, no fixed reference point is used for measurements. The touch controller 208 may generate signals that are sent directly to the first or second sets 204, 206 of electrodes in various patterns.

In some cases, the component does not depend upon an absolute capacitive measurement to determine the location of a finger (or stylus, pointer, or other object) on a surface of the capacitance module 200. The capacitance module 200 may measure an imbalance in electrical charge to the electrode functioning as a sense electrode which can, in some examples, be any of the electrodes designated in either set 204, 206 or, in other examples, with dedicated-sense electrodes. When no pointing object is on or near the capacitance module 200, the capacitance controller 208 may be in a balanced state, and there is no signal on the sense electrode. When a finger or other pointing object creates imbalance because of capacitive coupling, a change in capacitance may occur at the intersections between the sets of electrodes 204, 206 that make up the touch/proximity sensitive area. In some cases, the change in capacitance is measured. However, in alternative example, the absolute capacitance value may be measured.

While this example has been described with the capacitance module 200 having the flexibility of the switching the sets 204, 206 of electrodes between sense and transmit electrodes, in other examples, each set of electrodes is dedicated to either a transmit function or a sense function.

Figure 3:
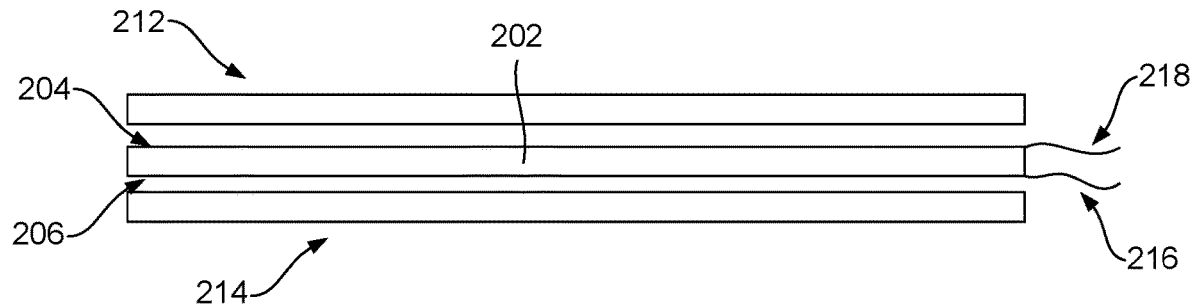
FIG. 3 depicts an example of a touch pad in accordance with the disclosure.

FIG. 3 depicts an example of a substrate 202 with a first set 204 of electrodes and a second set 206 of electrodes deposited on the substrate 202 that is incorporated into a capacitance module. The first set 204 of electrodes and the second set 206 of electrodes may be spaced apart from each other and electrically isolated from each other. In the example depicted in FIG. 3, the first set 204 of electrodes is deposited on a first side of the substrate 202, and the second set 206 of electrodes is deposited on the second side of the substrate 202, where the second side is opposite the first side and spaced apart by the thickness of the substrate 202. The substrate may be made of an electrically insulating material thereby preventing the first and second sets 204, 206 of electrodes from shorting to each other. As depicted in FIG. 2, the first set 204 of electrodes and the second set 206 of electrodes may be oriented transversely to one another. Capacitance measurements may be taken where the intersections with the electrodes from the first set 204 and the second set 206 overlap. In some examples, a voltage may be applied to the transmit electrodes and the voltage of a sense electrode that overlaps with the transmit electrode may be measured. The voltage from the sense electrode may be used to determine the capacitance at the intersection where the sense electrode overlaps with the transmit electrode.

In the example of FIG. 3 depicting a cross section of a capacitance module, the substrate 202 may be located between a capacitance reference surface 212 and a shield 214. The capacitance reference surface 212 may be a covering that is placed over the first side of the substrate 202 and that is at least partially transparent to electric fields. As a user's finger or stylus approach the capacitance reference surface 212, the presence of the finger or the stylus may affect the electric fields on the substrate 202. With the presence of the finger or the stylus, the voltage measured from the sense electrode may be different than when the finger or the stylus are not present. As a result, the change in capacitance may be measured.

The shield 214 may be an electrically conductive layer that shields electric noise from the internal components of the electronic device. This shield may prevent influence on the electric fields on the substrate 202. In some cases, the shield is solid piece of material that is electrically conductive. In other cases, the shield has a substrate and an electrically conductive material disposed on at least one substrate. In yet other examples, the shield is layer in the touch pad that performs a function and also shields the electrodes from electrically interfering noise. For example, in some examples, a pixel layer in display applications may form images that are visible through the capacitance reference surface, but also shields the electrodes from the electrical noise.

The voltage applied to the transmit electrodes may be carried through an electrical connection 216 from the touch controller 208 to the appropriate set of electrodes. The voltage applied to the sense electrode through the electric fields generated from the transmit electrode may be detected through the electrical connection 218 from the sense electrodes to the touch controller 208.

While the example of FIG. 3 has been depicted as having both sets of electrodes deposited on a substrate, one set of electrodes deposited on a first side and a second set of electrodes deposited on a second side; in other examples, each set of electrodes may be deposited on its own dedicated substrate.

Further, while the examples above describe a touch pad with a first set of electrodes and a second set of electrodes; in some examples, the capacitance module has a single set of electrodes. In such an example, the electrodes of the sensor layer may function as both the transmit and the receive electrodes. In some cases, a voltage may be applied to an electrode for a duration of time, which changes the capacitance surrounding the electrode. At the conclusion of the duration of time, the application of the voltage is discontinued. Then a voltage may be measured from the same electrode to determine the capacitance. If there is no object (e.g., finger, stylus, etc.) on or in the proximity of the capacitance reference surface, then the measured voltage off of the electrode after the voltage is discontinued may be at a value that is consistent with a baseline capacitance. However, if an object is touching or in proximity to the capacitance reference surface, then the measured voltage may indicate a change in capacitance from the baseline capacitance.

In some examples, the capacitance module has a first set of electrodes and a second set of electrodes and is communication with a controller that is set up to run both mutual capacitance measurements (e.g., using both the first set and the second set of electrodes to take a capacitance measurement) or self-capacitance measurements (e.g., using just one set of electrodes to take a capacitance measurement).

Figure 4:
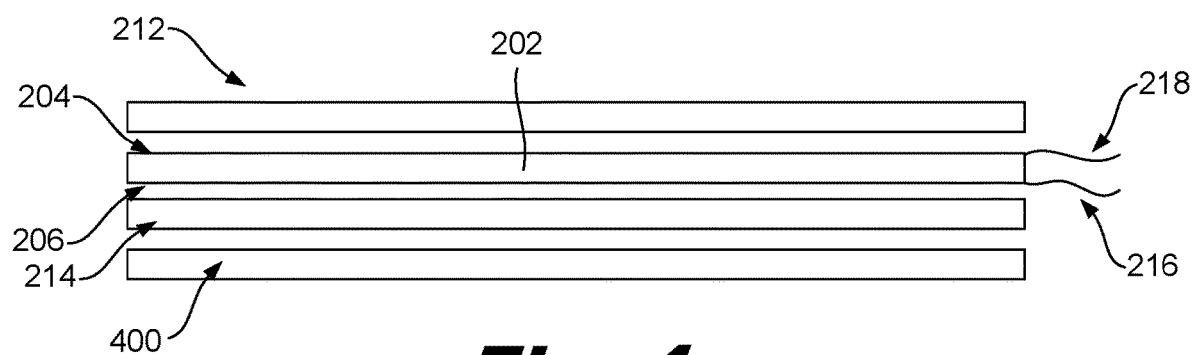
FIG. 4 depicts an example of a touch screen in accordance with the disclosure.

FIG. 4 depicts an example of a capacitance module incorporated into a touch screen. In this example, the substrate 202, sets of electrodes 204, 206, and electrical connections 216, 218 may be similar to the arrangement described in conjunction with FIG. 3. In the example of FIG. 4, the shield 214 is located between the substrate 202 and a display layer 400. The display layer 400 may be a layer of pixels or diodes that illuminate to generate an image. The display layer may be a liquid crystal display, a light emitting diode display, an organic light emitting diode display, an electroluminescent display, a quantum dot light emitting diode display, an incandescent filament display, a vacuum florescent display, a cathode gas display, another type of display, or combinations thereof. In this example, the shield 214, the substrate 202, and the capacitance reference surface 212 may be at least partially optically transparent to allow the image depicted in the display layer to be visible to the user through the capacitance reference surface 212. Such a touch screen may be included in a monitor, a display assembly, a laptop, a mobile phone, a mobile device, an electronic tablet, a dashboard, a display panel, an infotainment device, another type of electronic device, or combinations thereof.

Figure 5:
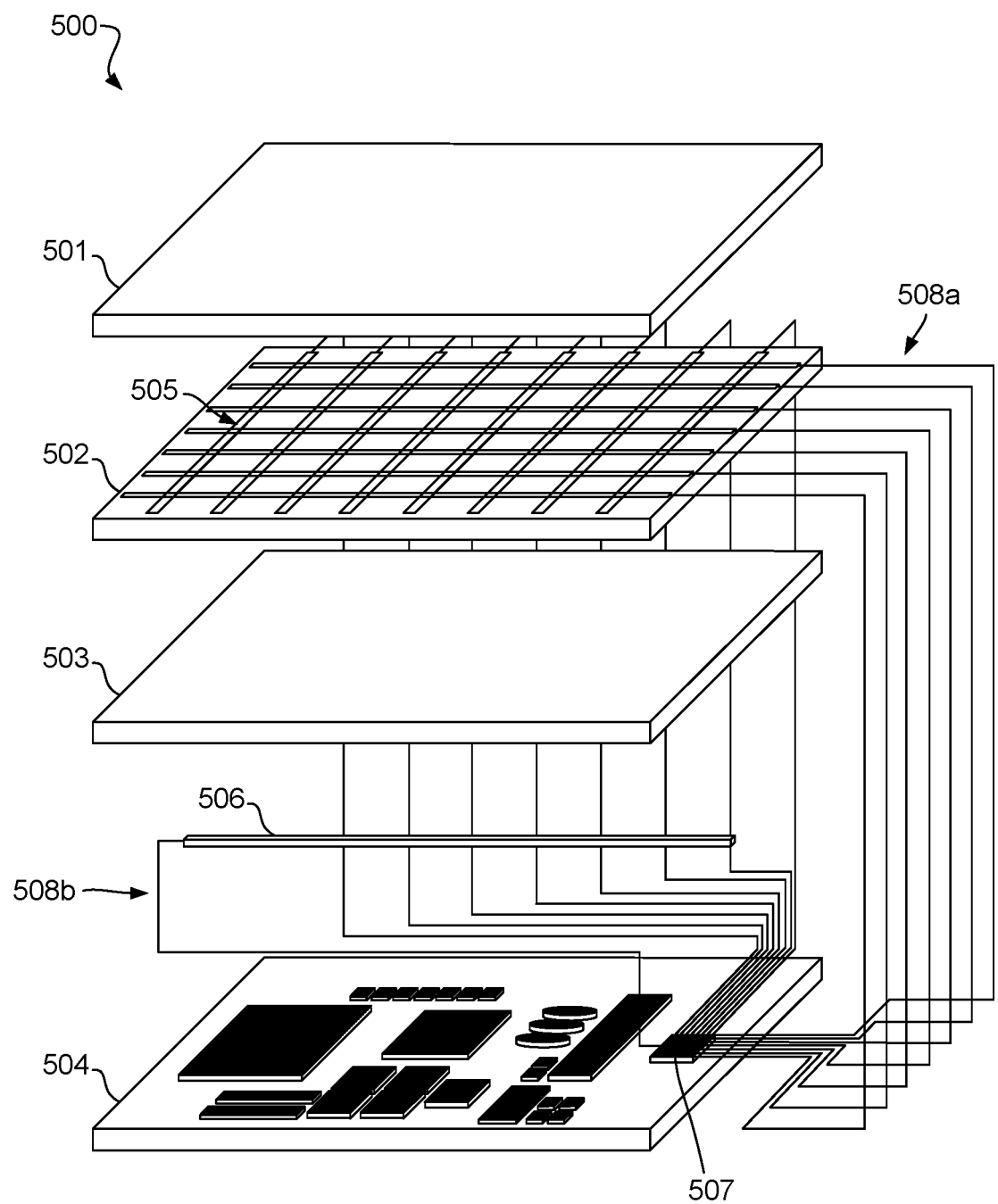
FIG. 5 depicts an example of a capacitance module in accordance with the disclosure.

FIG. 5 depicts an example of a capacitance module 500 in accordance with the disclosure. In this example, the capacitance module 500 includes a capacitance reference surface 501, a sensor layer 502, a shield layer 503, and a component layer 504. In this example, a noise sense electrode 506 is located in between the shield layer 503 and the component layer 504.

While the capacitance module 500 in this example includes four layers, in other examples, a capacitance module may include a different number of layers. In other examples, a capacitance module may include two layers, three layers, five layers, another number of layers, or combinations thereof.

The sensor layer 502 is located adjacent to the capacitance reference surface 501. The sensor layer 502 includes a capacitance sensor 505 that includes a set of capacitance electrodes. The capacitance sensor 505 may be used to detect a user input on the capacitance reference surface. In this example, the capacitance sensor 505 is a mutual capacitance sensor. In other examples, a capacitance sensor may be a self-capacitance sensor.

The capacitance sensor 505 is electrically connected to a controller 507 located on the component layer 504 by electrical connections 508a. The electrical connections 508a may electrically connect the controller 507 to each electrode in the capacitance sensor 505.

The controller 507 may activate the capacitance sensor 505 to take a capacitance measurement. In this example, the capacitance sensor 505 may take a capacitance measurement by applying a voltage to the transmit electrodes in the sensor and measuring the capacitance change using capacitance sense electrode in the sensor. The voltage applied to the transmit electrodes may be an alternating current voltage or a direct current voltage. The controller 507 may measure a capacitance change with sampling the voltage on the capacitance sense electrode periodically according to a sampling frequency. The sampling frequency used to measure a capacitance measurement may be determined with the controller 507.

The controller may include separate programming to the use the noise sense electrode 506. The noise sense electrode 506 may be electrically independent from the capacitance electrodes of the capacitance sensor 505. In some embodiments, a noise measurement may be taken with the noise sense electrode 506 where the transmit electrodes of the capacitance sensor has at least a minimal influence on the noise sense electrode 506. In some examples, the noise sense electrode 506 is separated from the set of capacitance electrodes of the capacitance sensor 505, which is used to detect the location of a user input. The noise sense electrode 506 may be electrically isolated from the set of electrodes by being part of an independent circuit from the set of capacitance electrodes of the capacitance sensor 505, being shielded from the transmit electrodes of the capacitance sensor, being space apart from the transmit electrodes of the capacitance sensor, other isolation mechanisms, or combinations thereof. In some examples, when a noise measurement is taken the transmit electrodes may not fluence the capacitance reading taken with the noise sense electrode 506. As a result, in some examples the noise measurement is taken without or at least with only a reduced amount of influence from the capacitance sensor 505. This may allow for circumstances where the noise sense electrode 506 can take a noise measurement at the same time that a capacitance measurement is taken with the set of capacitance sensors. Thus, the noise level present at the same time that the capacitance measurement is taken can associated with the capacitance measurement.

In some conventional approaches to taking noise measurements with electrodes that are used in the capacitance sensor, the capacitance sense electrode form overlaps with at least one transmit electrode. In this situation, the capacitance sense electrode may be influenced with the transmit electrodes and, thus, the noise measurements being taken with capacitance sense electrode that are part of the capacitance touch sensor may not be as accurate. However, in the example depicted in FIG. 5, the noise sense electrode 506 is shielded from the transmit electrodes of the capacitance sensor 505 with the shield 503. Thus, when the transmit electrodes are activated to enhance a capacitance field to be measured by the capacitance sense electrode of the capacitance sensor, the noise sense electrode may not be affected or at least the effect is reduced due to the shielding.

In some other conventional cases, the transmit electrodes may not be turned on when a noise measurement is taken with capacitance sense electrodes that are incorporated into the capacitance sensor's measurement circuit. In this case, the noise measurement cannot be taken when the capacitance measurement is being taken because the capacitance measurement involves activating the transmit electrodes. As a result, noise measurements may be taken at different frequencies to determine the noise level at the different frequencies. In some cases, noise levels can change so frequently in capacitance measurements that by the time that a frequency is selected, the noise levels have already changed. The principles of the current disclosure allow for the noise measurements to be taken at the same time as the capacitance measurements. For example, a first noise measurement may be taken at a first frequency with a first capacitance measurement. Then a second noise measurement may be taken at a second frequency with a second capacitance measurement. If the noise measurements indicate that there was less noise when the first capacitance measurement was taken, then the first capacitance measurement may be used to determine the location of the user's input. On the other hand, if the comparison between the first noise measurement and the second noise measurement indicates that there was less noise during the second capacitance measurement, than the second capacitance measurement may be used to determine the location of the user input.

In other examples, a first noise measurement may be taken with the noise sense electrode 506 at a first frequency and a second noise measurement may be taken with a second frequency. In some cases, multiple noise sense electrodes are used at the same time to take multiple measurements at different frequencies at one time. In other examples, multiple signals with different frequencies are imposed on the noise sense electrode at the same time. In this case, the noise levels at different frequencies are determined at the same time with a single noise sense electrode 506. In yet other examples, different noise measurements may be taken with the same noise sense electrode at different times and compared to each other to determine the different noise levels.

A comparison of the different noise levels at different frequencies may indicate at which frequency the noise is lowest. The system may determine to take a capacitance measurement with the capacitance sensor at the frequency that is associated with the lowest noise at that time. Since noise levels change often in capacitance measuring systems, if the process of determining the noise level per frequency may takes place before each capacitance measurement, before every other capacitance measurement, before a group of measurement, or combinations thereof.

The component layer 504 is located adjacent to the shield layer 503. The component layer 504 may include components used in the operation of the capacitance module 500. Components may include but are not limited to a central processing unit (CPU), a digital signal processor (DSP), an analog front end (AFE), an amplifier, a peripheral interface controller (PIC), another type of microprocessor, an integrated circuit, a field programmable gate array (FPGA), an application specific integrated circuit (ASIC), a combination of logic gate circuitry, other types of digital or analog electrical components, or combinations thereof. In this example, the component layer 504 includes the controller 507 which is electrically connected to the capacitance sensor 505.

In this example, a noise sense electrode 506 is located in between the shield layer 503 and the component layer 504. The noise sense electrode 506 may be electrically connected to the controller 507 with an electrical connection 508b. The sense electrode may be activated with the controller 507 to take a noise measurement. While this example has been described with the shield layer 503 shielding the noise sense electrode, other shield may be used to shield the noise sense electrode from the transmit electrodes of the capacitance sensor 505.

In this example, the noise sense electrode 506 is located in between the shield layer 503 and the component layer 504 of the capacitance module 500. In other examples, a sense electrode may be located in a different part of a capacitance module. The location of a sense electrode may be based, in part, on regions of noise in a capacitance module or a system in which a capacitance module is a part of that system. In this example, the noise sense electrode 506 is located near components on the component layer 504 which may generate electrical noise. In other examples, a sense electrode may be located near an antenna in a capacitance module. In other examples, a sense electrode may be located outside of a capacitance module's structure near a battery in a system.

In some examples, the sampling frequency used to take a noise measurement using the noise sense electrode 506 may be different than the sampling frequency used to take a noise measurement using the capacitance sensor 505. For example, the controller 507 may take a noise measurement using the noise sense electrode 506 at a sampling frequency of 1 kilohertz (KHz) while taking a noise measurement using the capacitance sensor 505 at a sampling frequency of 2 KHz.

The sampling frequency of a noise measurement may correspond to the sampling frequency of a capacitance measurement. In cases where the controller 507 takes multiple noise measurements using the noise sense electrode 506 and the capacitance sensor 505 at different frequencies, the controller may compare the amplitude of the two noise measurements and take a capacitance measurement using the sampling frequency corresponding to the noise measurement with the lower amplitude. By taking a capacitance measurement using the sampling frequency corresponding to the noise measurement with less noise, noise in the capacitance measurement may be reduced, improving the accuracy and precision of the capacitance sensor 505 in the capacitance module 500.

Figure 6:
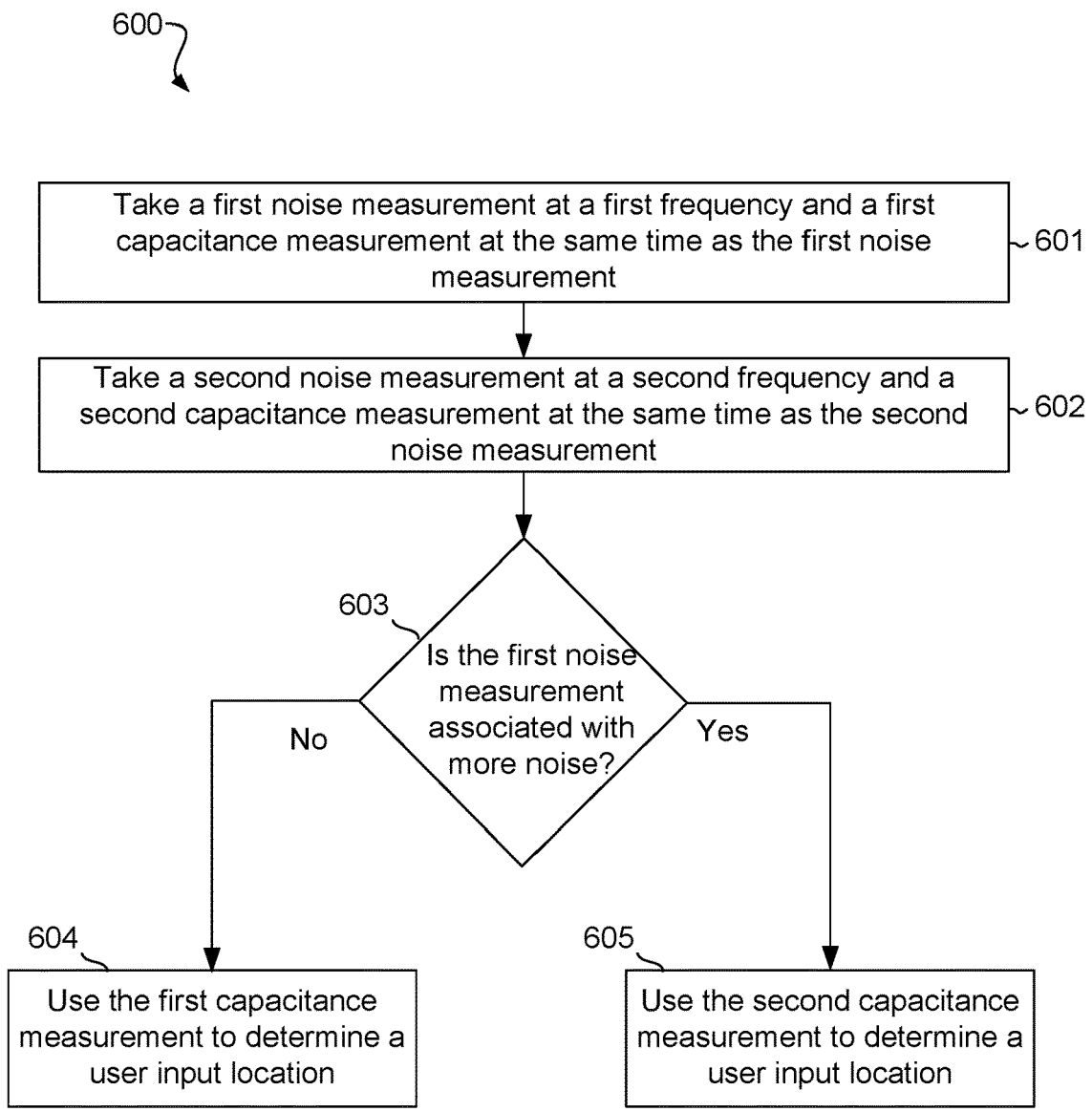
FIG. 6 depicts an example of a method for determining a location of user input using a capacitance module.

FIG. 6 depicts a method 600 for determining a location of user input using a capacitance module in accordance with the disclosure. This method 600 may be performed based on the description of the devices, modules, and principles described in relation to FIGS. 1-5 and 8-14. In this example, the method includes taking 601 a first noise measurement at a first frequency and a first capacitance measurement at the same time as the first noise measurement; and taking 602 a second noise measurement at a second frequency and a second capacitance measurement at the same time as the second noise measurement. The first noise measurement and second noise measurement may be taken using a noise sense electrode on or off of the capacitance module, but that is electrically isolated or at least insulated from the transmit electrodes of the capacitance sensor.

The method 600 may also include determining 603 whether the first noise measurement is associated with more noise. If not, then the method 600 includes using 604 the first capacitance measurement to determine a user input location. If the first noise measurement is associated with more noise, then the method 600 includes using 605 the second capacitance measurement to determine a user input location.

The amount of noise measured in each noise measurement may be determined with a controller or processing resources in a capacitance module. In some examples, the noise in a noise measurement may be determined by calculating the peak-to-peak voltage of the measurement. In other examples, the noise may be determined by calculating the root mean squared (RMS) voltage of the measurement. In yet other examples, the noise may be determined with multiple calculations, including the peak-to-peak voltage, the RMS voltage, another calculation, or combinations thereof.

Figure 7:
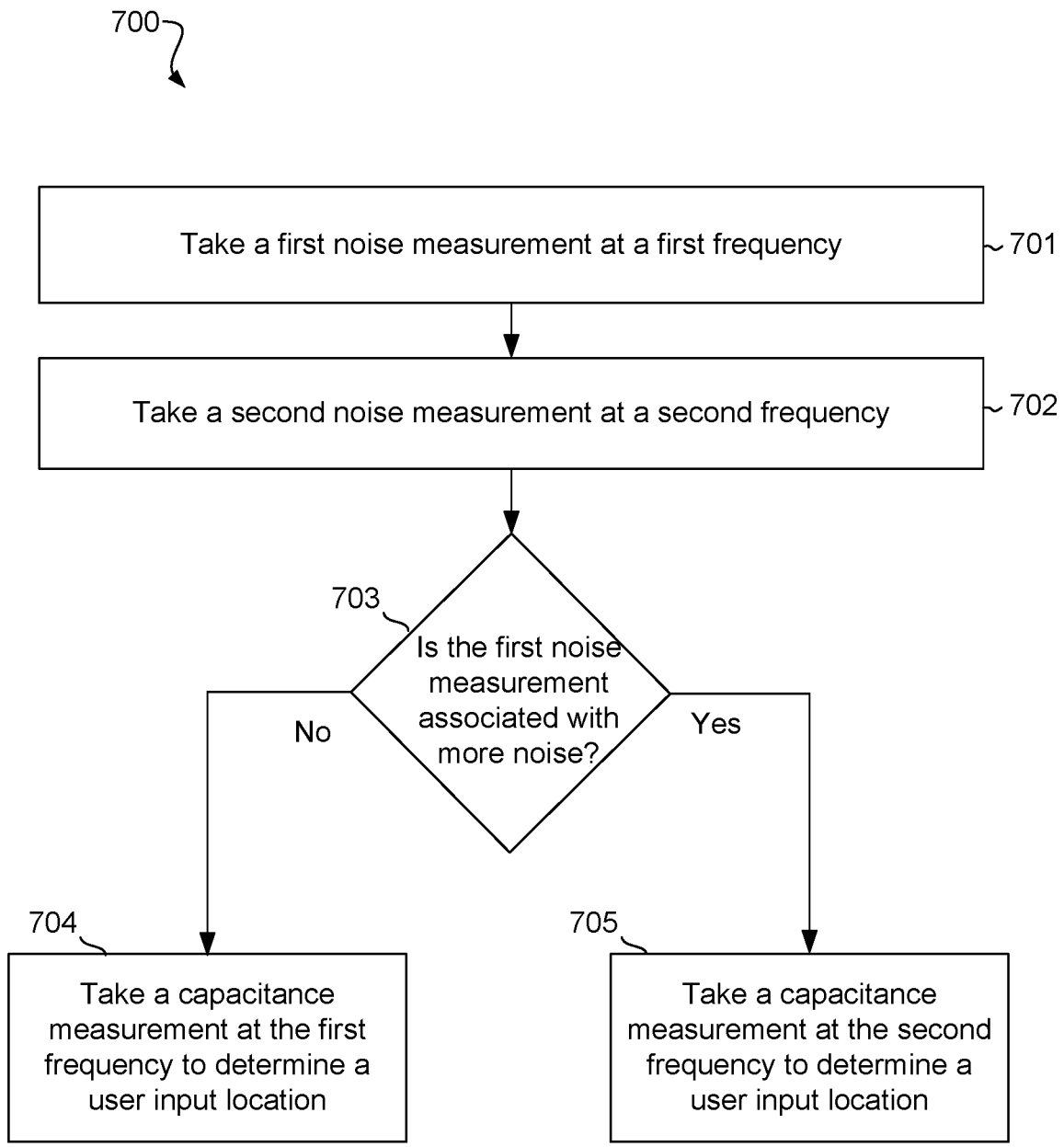
FIG. 7 depicts an example of a method for determining a location of user input using a capacitance module.

FIG. 7 depicts a method 700 for determining a location of user input using a capacitance module in accordance with the disclosure. This method 700 may be performed based on the description of the devices, modules, and principles described in relation to FIGS. 1-5 and 8-14. The method 700 includes taking 901 a first noise measurement at a first frequency and taking 902 a second noise measurement at a second frequency.

The method 700 may also include determining 703 whether the first noise measurement is associated with more noise. If not, then the method 700 includes taking 704 a capacitance measurement at the first frequency to determine a user input location. If the first noise measurement is associated with more noise, then the method 700 includes taking 705 a capacitance measurement at the second frequency to determine a user input location.

Figure 8A:
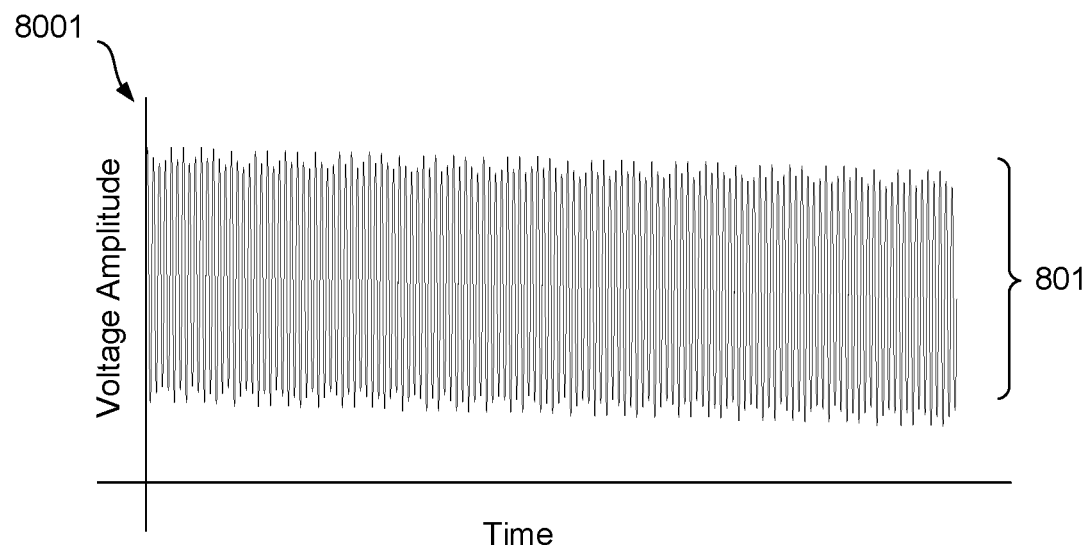
FIG. 8a depicts an example of signal graphs in accordance with the disclosure.
Figure 8B:
FIG. 8b depicts an example of signal graphs in accordance with the disclosure.

FIGS. 8a and 8b depict examples of signal graphs in accordance with the disclosure. For illustrative purposes, a first noise measurement is depicted in a first graph 800b, and a second noise measurement is depicted in a second graph 800b. The first noise measurement and the second noise measurement are depicted as voltage amplitudes versus time. The peak-to-peak voltage 801 of the first noise measurement is greater in magnitude than the peak-to-peak voltage 802 of the second noise measurement. In an example where the first noise measurement and second noise measurement are compared, a capacitance measurement taken at the sampling frequency of the second noise measurement may be used to determine a location of user input, because a capacitance measurement taken at the sampling frequency of the second noise measurement may have less noise than a capacitance measurement taken at the sampling frequency of the first noise measurement.

Determining the amount of noise in a noise measurement by calculating the peak-to-peak voltage of the noise measurement may be used. When the sampling period of the measurement is short, the peak-to-peak voltage measurement may be sufficient for determining the amount of noise. In other examples, such as when a sampling period of the noise measurement is longer, may be advantageous to use the RMS voltage to measure noise.

Figure 9:
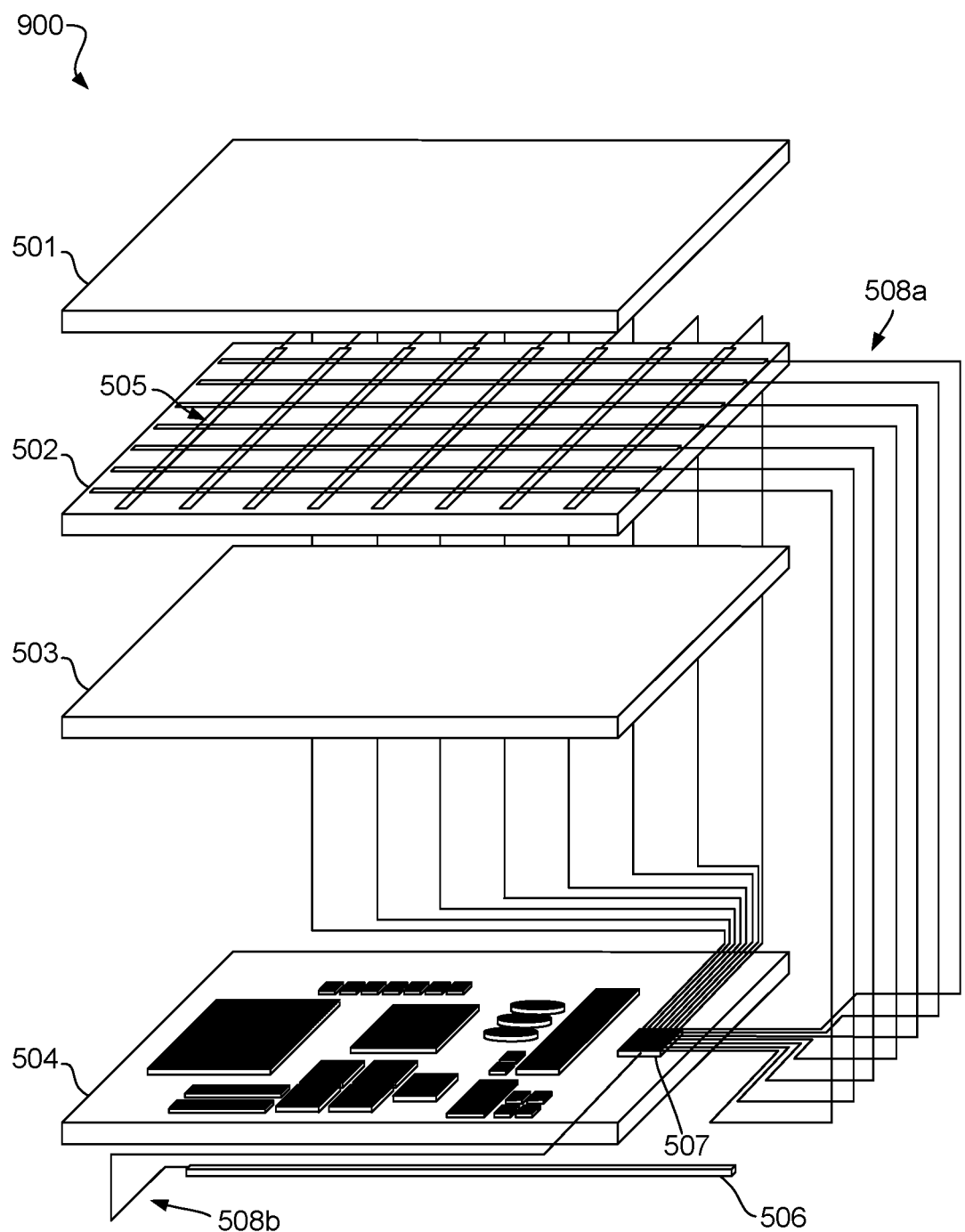
FIG. 9 depicts an example of a capacitance module in accordance with the disclosure.

FIG. 9 depicts an example of a capacitance module 900 in accordance with the disclosure. In this example, the noise sense electrode 506 is located adjacent to the component layer 504 instead of located in between the shield layer 503 and the component layer 504 as depicted in FIG. 5. In some examples, the noise sense electrode 506 may be deposited onto the component layer 504. In other examples, the noise sense electrode 504 may be located off of the capacitance module, but still be located near to or adjacent to the component layer 504 of the capacitance module.

Figure 10:
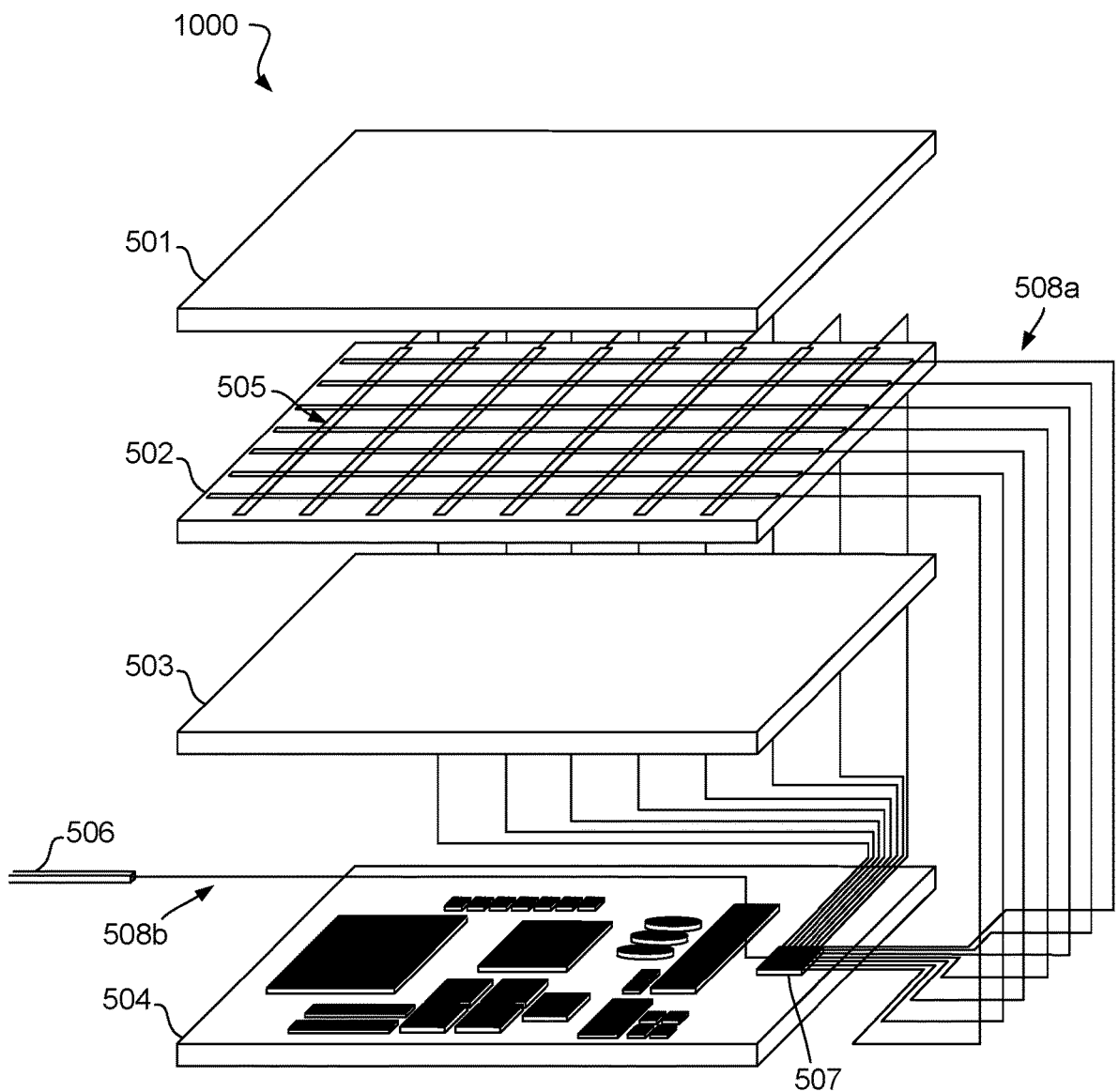
FIG. 10 depicts an example of a capacitance module in accordance with the disclosure.

FIG. 10 depicts an example of a capacitance module 1000 in accordance with the disclosure. In this example, the noise sense electrode 506 is located outside of the structure of the capacitance module 700. Although the noise sense electrode 506 is located outside of the structure of the capacitance module, noise sense electrode 506 may still communicate the controller 507 with the electrical connection 508b or through a wireless connection. The noise sense electrode 506 may be located near a region of noise in a system, even if the region of noise is not within the capacitance module 700 itself. For example, a noise source may be located in the capacitance module, next to the capacitance module, or close enough to the capacitance module, and the noise sense electrode may be placed next to such a noise source. The noise sense electrode 506 may be placed near enough to the noise source to obtain a sense measurement. In some cases, the noise source may be a battery, an antenna, an electrical conductor, a sensor, a processor, a motor, a haptic device, an actuator, a circuit, a transmitter, a switch, a component of a laptop, a component of a phone, a component of an electrical device, another type of component, or combinations thereof.

Figure 11:
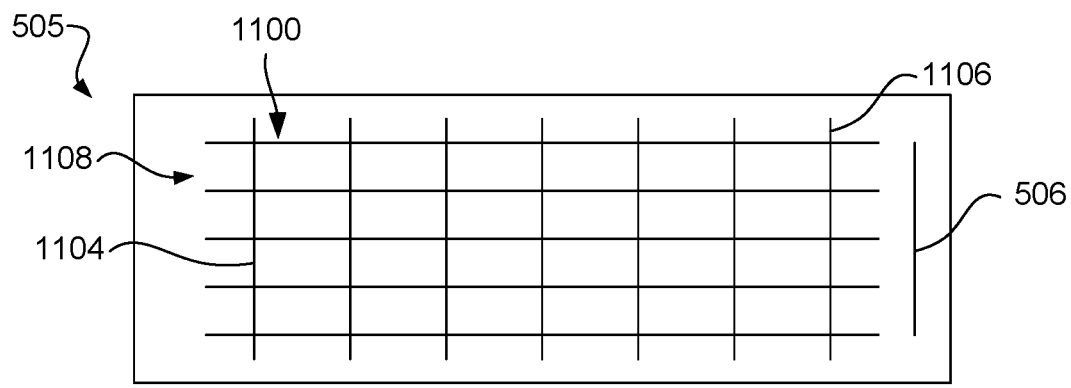
FIG. 11 depicts an example of a noise sense electrode in accordance with the disclosure.
Figure 12:
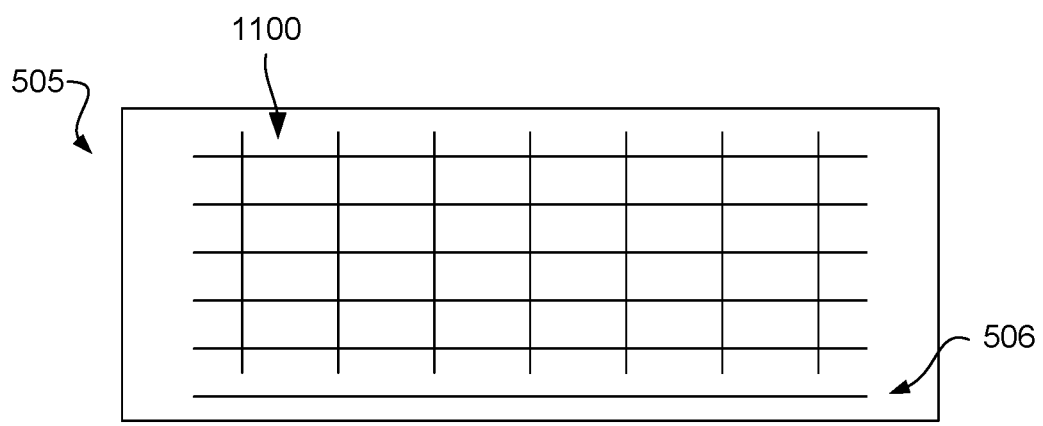
FIG. 12 depicts an example of a noise sense electrode in accordance with the disclosure.

FIG. 11 depicts an example of a capacitance sensor 505 with capacitance electrodes 1100 that are used to determine a user's input location. These capacitance electrodes include both transmit and capacitance sense electrodes that are spaced apart from each other to prevent electrical shorting. In some examples, the transmit electrodes may be located on a first side of a substrate and the capacitance sense electrodes may be located on the other side. In this example, a noise sense electrode 506 is located on the same surface as the capacitance electrodes 1100. The noise sense electrode 506 may be spaced far away enough from the transmit electrodes of the capacitance sensor to be effectively shielded from their influence when the noise sense electrode takes a noise measurement.

In some examples, a single transmit electrode 1104 may be used to take a capacitance measurement at the same time that the noise sense electrode 506 is taking a noise measurement. In this example, just the single transmit electrode 1104 may be activated, which may be located farther away from the noise sense electrode 506 than a nearest transmit electrode 1106. The distance between the single transmit electrode 1104 and the noise transmit electrode 506 may be sufficient to effectively shield the noise sense electrode 506 from the single transmit electrode 1104. However, in some examples, even the distance between the nearest transmit electrode 1106 and the noise sense electrode 506 may be sufficient to effectively shield the noise sense electrode 506 from the single transmit electrode 1104.

The transmit electrodes and the sense electrodes of the capacitance sensor 505 may be connected to a capacitance measuring circuit that is programmed to detect the located of a user's input. This circuit may include applying a voltage to the transmit electrodes, which cross over the capacitance sense electrodes 1108 and change the electric fields between the transmit electrodes and the capacitance sense electrodes. The capacitance sense electrodes may be used to measure the changes in the electric capacitance as a result of the voltage applied to the transmit electrodes. The noise sense electrode 506 may be independent of this circuit used to determine the location of the user's input.

In the example depicted in FIG. 11, the noise sense electrode 506 is depicted being transverse to the sense electrodes 1108 of the capacitance sensor 505. In the example depicted in FIG. 12, the noise sense electrode 506 is depicted being aligned with the sense electrodes 1108 of the capacitance sensor 505.

Figure 13:
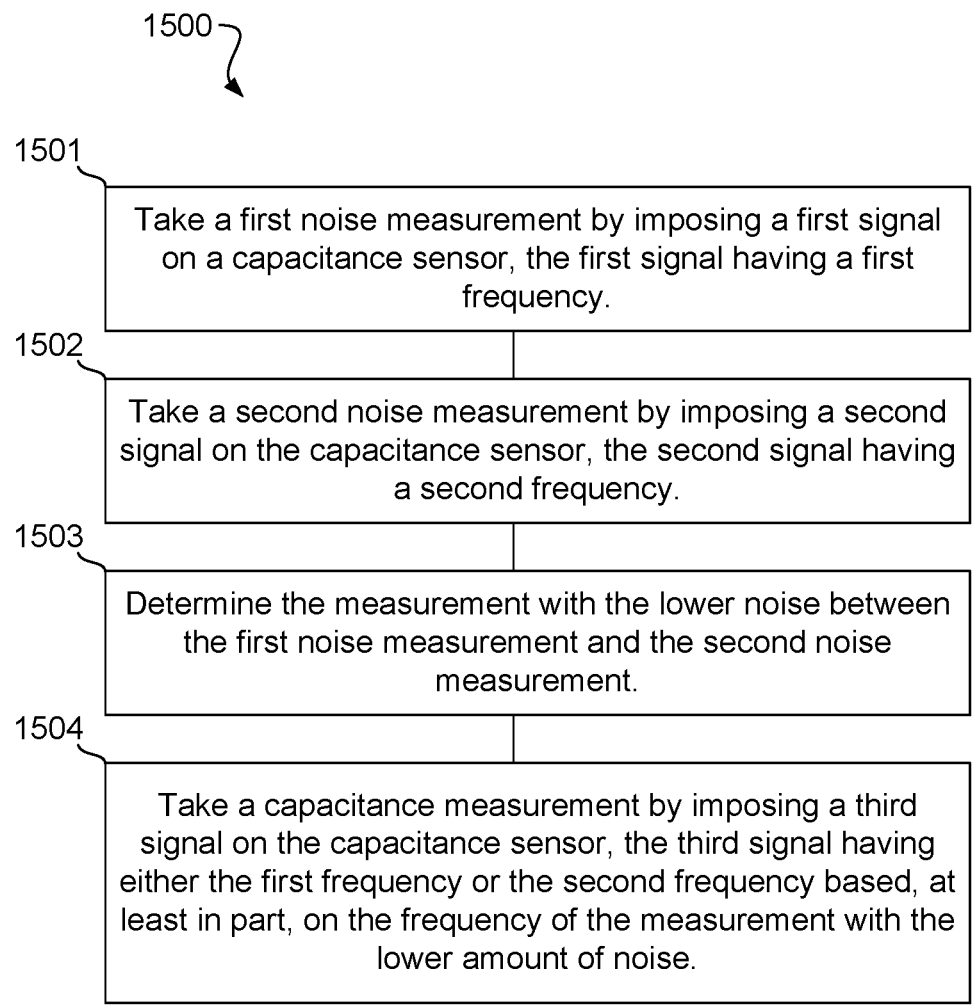
FIG. 13 depicts an example of a method for determining a location of user input using a capacitance module.

FIG. 13 depicts an example of a method 1300 for determining a location of user input using a capacitance module. This method 1300 may be performed based on the description of the devices, modules, and principles described in relation to FIGS. 1-12. The method 1300 includes taking 1301 a first noise measurement by imposing a first signal on a capacitance sensor, the first signal having a first frequency; taking 1302 a second noise measurement by imposing a second signal on the capacitance sensor, the second signal having a second frequency; determining 1303 the measurement with the lower noise between the first noise measurement and the second noise measurement; and taking 1304 a capacitance measurement by imposing a third signal on the capacitance sensor, the third signal having either the first frequency or the second frequency based, at least in part, on the frequency of the measurement with the lower amount of noise.

Figure 14:
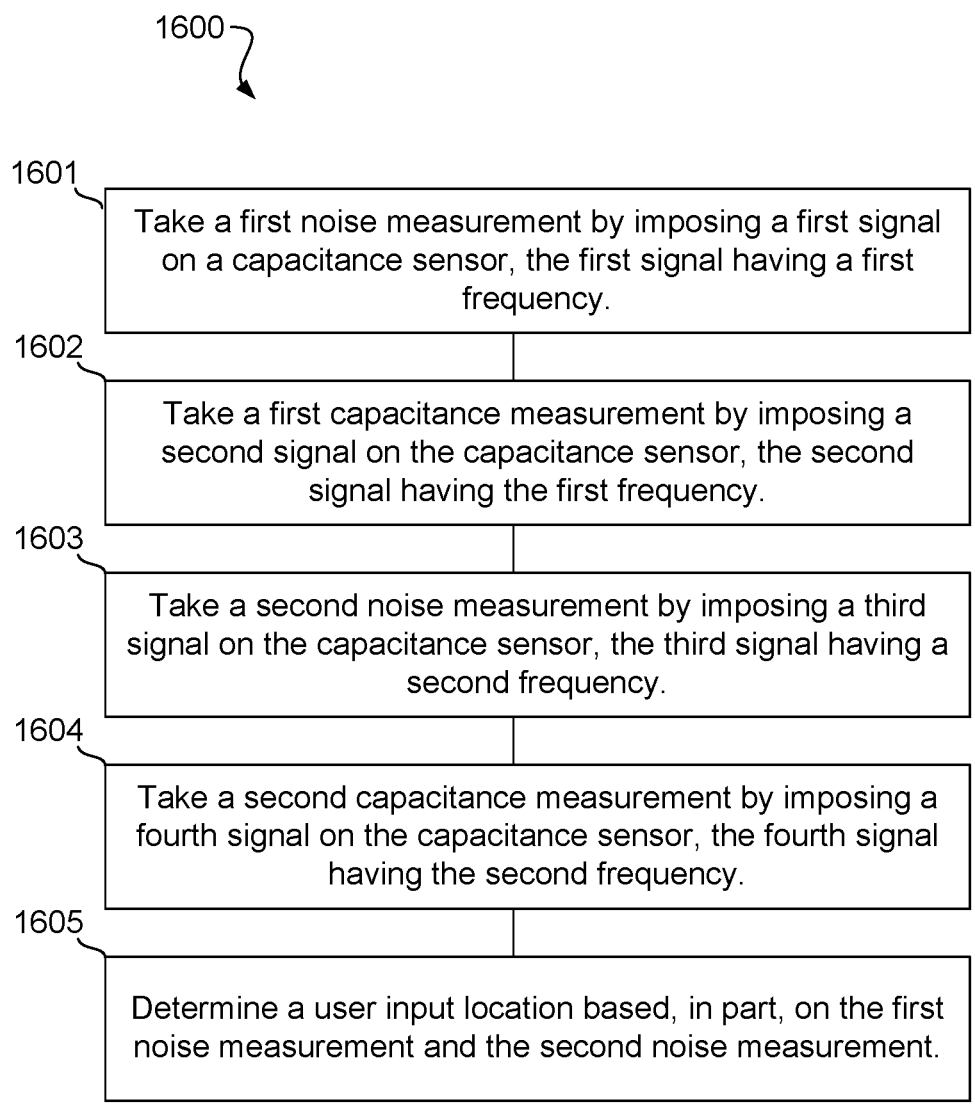
FIG. 14 depicts an example of a method for determining a location of user input using a capacitance module.

FIG. 14 depicts an example of a method 1400 for determining a location of user input using a capacitance module. This method 1400 may be performed based on the description of the devices, modules, and principles described in relation to FIGS. 1-12. The method 1400 includes taking 1401 a first noise measurement by imposing a first signal on a capacitance sensor, the first signal having a first frequency, taking 1402 a first capacitance measurement by imposing a second signal on the capacitance sensor, the second signal having the first frequency, taking 1403 a second noise measurement by imposing a third signal on the capacitance sensor, the third signal having a second frequency, taking 1404 a second capacitance measurement by imposing a fourth signal on the capacitance sensor, the fourth signal having the second frequency, and determining 1505 a user input location based, in part, on the first noise measurement and the second noise measurement.

It should be noted that the methods, systems, and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner. Also, it should be emphasized that technology evolves and, thus, many of the elements are exemplary in nature and should not be interpreted to limit the scope of the invention.

Specific details are given in the description to provide a thorough understanding of the embodiments. However, it will be understood by one of ordinary skill in the art that the embodiments may be practiced without these specific details. For example, well-known circuits, processes, algorithms, structures, and techniques have been shown without unnecessary detail in order to avoid obscuring the embodiments.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

The invention claimed is:

1. A capacitance module, comprising:
a set of electrodes;
a noise sense electrode electrically independent from the set of capacitance electrodes;
processing resources in electrical communication with the set of capacitance electrodes and the noise sense electrode;
wherein the processing resources include a processor and memory, the memory including programmed instructions that cause the processor, when executed, to:
take a first noise measurement by imposing a first signal on the noise sense electrode, the first signal having a first frequency;
take a second noise measurement by imposing a second signal on the noise sense electrode, the second noise signal having a second frequency; and
take a capacitance measurement by imposing a third signal on the set of capacitance electrodes, the third signal having a third frequency where the third frequency is the same as the first frequency when the first noise measurement is lower than the second noise measurement or the third frequency is the same as the second frequency when the second noise measurement is lower than the first noise measurement.

2. The capacitance module of claim 1, wherein the first noise measurement and second noise measurement are taken at the same time.

3. The capacitance module of claim 1, wherein the third frequency is the same as the first frequency or the same as the second frequency, based in part on the amplitude of the first noise measurement and the amplitude of the second noise measurement.

4. The capacitance module of claim 1, the programmed instructions including further instructions which cause the processor, when executed, to determine a location of user input based, in part, on the capacitance measurement.

5. The capacitance module of claim 1, wherein the location of the sense electrode is based, in part, on the regions of greatest noise in the capacitance module.

6. The capacitance module of claim 1, further comprising shielding material located between the set of electrodes and the sense electrode.

7. The capacitance module of claim 1, the programmed instructions including further instructions which cause the processor, when executed, to take a second capacitance measurement by imposing a fourth signal on the set of electrodes, the fourth signal having a fourth frequency.

8. The capacitance module of claim 7, wherein the first input signal and the first noise signal are measured at the same time, and the second input signal and the second noise signal are measured at the same time.

9. The capacitance module of claim 7, further comprising shielding that electrically isolates the noise sense electrode from the set of capacitance electrodes.

10. The capacitance module of claim 7, the programmed instructions including further instructions which cause the processor, when executed, to determine a location of user input based, in part, on the first noise measurement and the second noise measurement.

11. The capacitance module of claim 1, wherein the capacitance module is incorporated into a laptop.

12. The capacitance module of claim 1, wherein the capacitance module is incorporated into a mobile device.

13. The capacitance module of claim 1, wherein the capacitance module is incorporated into an electronic tablet.

14. The capacitance module of claim 1, wherein the capacitance module is incorporated into a display.

* * * * *